United States Patent
Fang et al.

(10) Patent No.: US 9,306,373 B2
(45) Date of Patent: Apr. 5, 2016

(54) SEMICONDUCTOR LASERS AND ETCHED-FACET INTEGRATED DEVICES HAVING NON-UNIFORM TRENCHES

(71) Applicant: Avago Technologies General IP (Singapore) Pte. Ltd., Singapore (SG)

(72) Inventors: Ruiyu Fang, Turin (IT); Giammarco Rossi, Turin (IT); Roberto Paoletti, Turin (IT)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 133 days.

(21) Appl. No.: 13/768,404

(22) Filed: Feb. 15, 2013

(65) Prior Publication Data

US 2014/0233596 A1  Aug. 21, 2014

(51) Int. Cl.
  *H01S 5/22* (2006.01)
  *H01S 5/02* (2006.01)
  *H01S 5/10* (2006.01)
  *H01S 5/343* (2006.01)

(52) U.S. Cl.
  CPC ............ *H01S 5/2202* (2013.01); *H01S 5/1082* (2013.01); *H01S 5/0201* (2013.01); *H01S 5/1014* (2013.01); *H01S 5/343* (2013.01)

(58) Field of Classification Search
  CPC ......... H01S 5/22; H01S 5/2202; H01S 5/343; H01S 5/0201; H01S 5/1082; H01S 5/1014; H01S 5/34
  USPC ...................................................... 372/45.01
  See application file for complete search history.

(56) References Cited

U.S. PATENT DOCUMENTS

| | | | |
|---|---|---|---|
| 4,958,355 A * | 9/1990 | Alphonse et al. | 372/45.01 |
| 5,608,749 A * | 3/1997 | Kizuki | 372/36 |
| 6,414,976 B1 * | 7/2002 | Hirata | 372/45.01 |
| 7,346,090 B2 | 3/2008 | Johnson et al. | |
| 7,678,593 B1 | 3/2010 | Fitz et al. | |
| 2002/0163002 A1 * | 11/2002 | Takagi | 257/79 |
| 2003/0091085 A1 * | 5/2003 | Northrup et al. | 372/50 |
| 2011/0097553 A1 | 4/2011 | Hong et al. | |
| 2012/0230358 A1 | 9/2012 | Botez et al. | |

OTHER PUBLICATIONS

Horst, et al., "High-Reflectance Dielectric Mirrors Deposited by Plasma-Enhanced Chemical Vapor Deposition on GaAs—AlGaAs Semiconductor Lasers with Inductively Coupled Plasma Etched Facets," IEEE Photonics Technology Letters, vol. 12(10), Oct. 2000, pp. 1325-1327.

Vettiger, et al., "Full-Wafer Technology—A New Approach to Large-Scale Laser Fabrication and Integration," IEEE Journal of Quantum Electronics, vol. 27(6), Jun. 1991, pp. 1319-1331.

Liang, et al., "Nonselective oxidation of GaAs-based III-V compound semiconductor heterostructures for in-plane semiconductor lasers," Photonics West, paper 6485-25, Jan. 20, 2007.

* cited by examiner

*Primary Examiner* — Xinning Niu

(57) ABSTRACT

An edge-emitting etched-facet optical semiconductor structure includes a substrate, an active multiple quantum well (MQW) region formed on the substrate, a ridge waveguide formed over the MQW region extending in substantially a longitudinal direction between a waveguide first etched end facet disposed in a first window and a waveguide second etched end facet disposed in a second window, and first and second trenches having non-uniform widths extending in substantially the longitudinal direction between the first and second windows.

18 Claims, 13 Drawing Sheets

= FIRST MASK

= SECOND MASK

= FIRST MASK

= SECOND MASK

= THIRD MASK

= THIRD MASK

SEMICONDUCTOR LASERS AND ETCHED-FACET INTEGRATED DEVICES HAVING NON-UNIFORM TRENCHES

BACKGROUND

Optical transceivers are key components in optical fiber-based telecommunications and data communication networks. An optical transceiver includes an opto-electronic light source, such as a laser, and an opto-electronic light receiver, such as a photodiode, and may also include various electronic circuitry associated with the laser and photodiode. For example, driver circuitry can be included for driving the laser in response to electronic signals received from the electronic system. Receiver circuitry can be included for processing the signals produced by the photodiode and providing output signals to the electronic system. Optical lenses are also commonly included.

Generally, there are two types of semiconductor laser devices: edge-emitting lasers and Vertical Cavity Surface Emitting Lasers (VCSELs). An advantage of VCSELs is that they can be tested economically at wafer level rather than chip level. Another advantage of VCSELs is their well-defined spot size, which promotes high coupling efficiency to optical fibers without the need to provide beam shape correction, thus facilitating economical packaging. Edge-emitting lasers also have advantages, such as robust reliability and high output optical power. Likely for these reasons, edge-emitting lasers remain the most commonly used semiconductor laser in high-speed optical transceivers. To test edge-emitting lasers, a wafer must be scribed and cleaved for single-chip testing. That is, wafers must be diced into bars, coated with highly-reflective (HR) or anti-reflective (AR) coatings, and then diced to single chips to be tested and selected. The process of testing edge-emitting lasers thus can be relatively uneconomical.

One way to reduce edge-emitting laser chip cost involves a process commonly referred to as etched facet. In an etched facet laser, the feedback mirrors are etched facets rather than cleaved facets. Etched facets facilitate coating the facet with HR or AR layers at wafer-level, rather than at bar level. (See, e.g., Peter Vettiger, et al., IEEE Journal of Quantum Electronics, Vol. 27(6), June 1991, p. 1319.)

Edge-emitting lasers can have either a ridge waveguide structure or a buried waveguide structure. The process of fabricating a ridge waveguide structure is less complex than the process of fabricating a buried waveguide structure. For uncooled lasers, the active core layers are commonly made of aluminum-containing multiple quantum well (MQW) layers. In such a laser, a ridge waveguide structure is more advantageous than a buried waveguide structure because a ridge waveguide structure does not have an etched MQW region or suffer from aluminum oxidation.

As illustrated in FIGS. 1-3 (not to scale), a known ridge waveguide laser structure 10 includes etched-facet windows 12 fabricated directly on the structure using a protection mask (not shown). The term "window" refers to a region etched down from the surface to the substrate. The facets defined by windows 12 are coated with either an HR or AR coating material, depending on whether the resulting structure is to be a Fabry-Perot (FP) laser or Distributed Feedback (DFB) laser. (For purposes of clarity, the relatively thin coating is not separately illustrated in the drawings.)

Multi-mask layers (not shown) are commonly used to fabricate a structure such as ridge structure 14. The first mask, which can be a Benzocyclobuten (BCB) layer, is used with an etch-back process to planarize the ridge. Then, an SiO2 mask is deposited on the BCB surface followed by photolithography and an SiO2 dry-etch process. An inductively coupled plasma (ICP) etch process is then performed to form windows 12. Lastly, the SiO2 and BCB layers are removed.

Additional fabrication steps can be performed on the resulting structure 10. A common additional step involves applying a photoresist material. Such photoresist material tends to flow into the relatively deep windows 12 and pool or accumulate there to a greater extent than in the mid-portion of the structure approximately mid-way between windows 12. As illustrated in FIG. 3, this effect causes the photoresist layer 16 to be thicker in the mid-portion than nearer to windows 12. (It can be noted that as multiple structures 10 are commonly fabricated together in end-to-end arrangements on a semiconductor wafer, two adjacent structures 10 share the window 12 in which the photoresist material pools.) Such non-uniform thickness of photoresist layer 16 can hamper further steps in the device fabrication process. It would be desirable to provide an etched-facet semiconductor laser or integrated device that poses fewer fabrication challenges than prior devices of this type.

SUMMARY

Embodiments of the present invention relate to an edge-emitting etched-facet optical semiconductor structure having a substrate, an active multiple quantum well (MQW) region formed on the substrate, a ridge waveguide formed over the MQW region extending in substantially a longitudinal direction between a waveguide first etched end facet and a waveguide second etched end facet, and first and second trenches having non-uniform widths. The waveguide first etched end facet is disposed in a first window, and the waveguide second etched end facet is disposed in a second window. The first and second windows extend in a depth direction from the ridge waveguide to the substrate and through the active MQW region. The waveguide first and second etched end facets have optical coatings. The first and second trenches extend in substantially the longitudinal direction along opposite sides of the ridge waveguide and in a depth direction down to the substrate and through the active MWQ region. Each of the first and second trenches is wider at its mid-portion than at its two end portions.

Embodiments of the present invention further relate to a method for fabricating the edge-emitting optical semiconductor structure. The method includes forming an active MQW region on a substrate, forming a first mask over the MQW region to define a ridge waveguide region, forming a ridge waveguide using the first mask, forming a second mask over the ridge waveguide, removing portions of the MQW region and substrate to form first and second trenches, removing the first and second masks, forming a third mask, removing portions of the MQW region and substrate to form first and second windows, removing the third mask, and coating the resulting waveguide etched end facets. Multiple devices can be fabricated together on a semiconductor wafer in end-to-end arrangements and then diced at the windows between adjacent devices.

Other systems, methods, features, and advantages will be or become apparent to one with skill in the art upon examination of the following figures and detailed description. It is intended that all such additional systems, methods, features, and advantages be included within this description, be within the scope of the specification, and be protected by the accompanying claims.

BRIEF DESCRIPTION OF THE DRAWINGS

The invention can be better understood with reference to the following drawings. The components in the drawings are

DETAILED DESCRIPTION

As illustrated in FIGS. 4-9 (not to scale), in an illustrative or exemplary embodiment of the invention, an etched-facet edge-emitting optical semiconductor structure 20 can serve as, for example, part of an edge-emitting laser. Although for purposes of clarity only a single semiconductor structure 20 is shown in FIGS. 4-9, it should be understood that many such adjoining structures can be formed on a semiconductor wafer and then diced or separated from one another.

Figure 6:
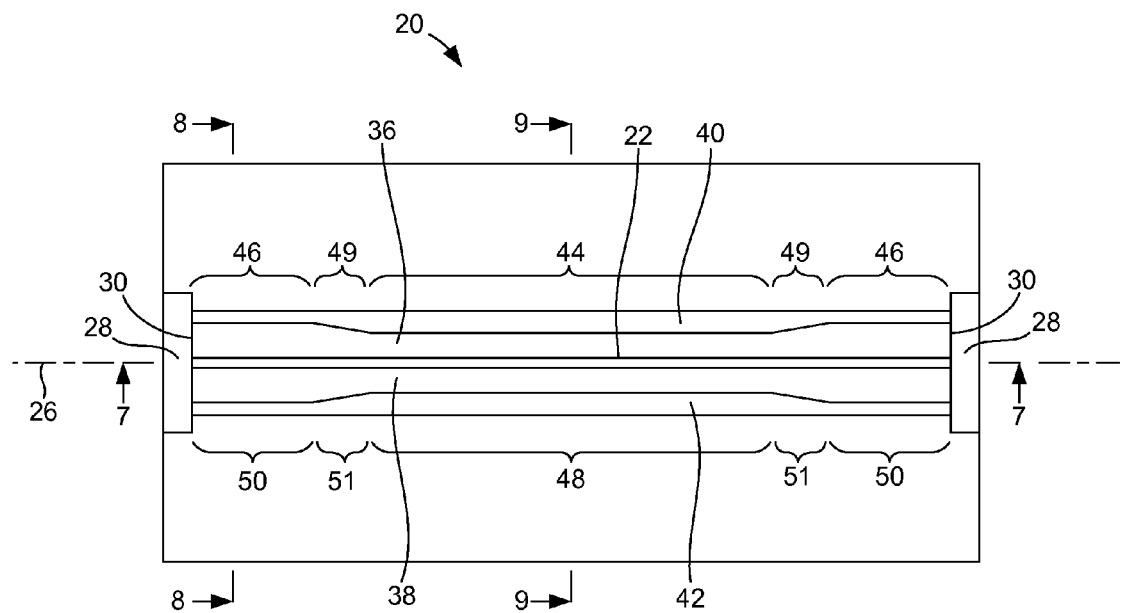
FIG. 6 is a schematic top plan view of the device of FIG. 4.
Figure 7:
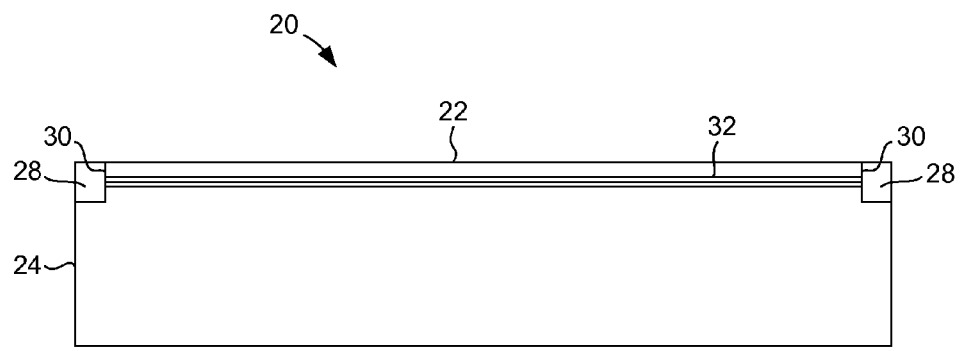
FIG. 7 is a sectional view taken on line 7-7 of FIG. 6.

In a manner described below, semiconductor structure 20 includes a ridge waveguide 22 formed on a semiconductor substrate 24 in an orientation parallel to a major plane of substrate 24. Ridge waveguide 22 extends between the ends of semiconductor structure 20 in a direction generally aligned with a longitudinal axis 26. The distance that ridge waveguide 22 extends in this direction is referred to herein as its "length." The term "width" refers to a direction perpendicular to length. The terms "depth," "above," "below," "up," "down," etc., refer to a direction normal to the major plane of substrate 24. At each end of semiconductor structure 20 is a window 28, etched down to substrate 24. Each of windows 28 has an etched end facet 30 (FIGS. 6-7). Etched end facets 30 are coated with an optical coating, such as a highly reflective (HR) coating or an anti-reflective (AR) coating.

Figure 8:
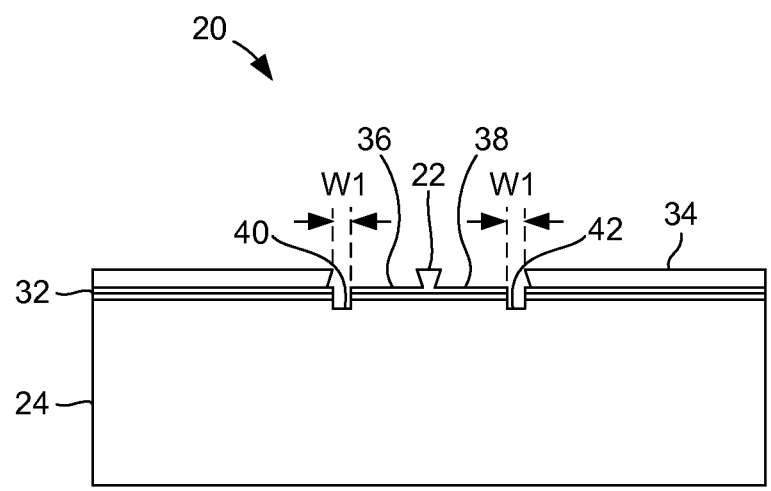
FIG. 8 is a sectional view taken on line 8-8 of FIG. 6.
Figure 9:
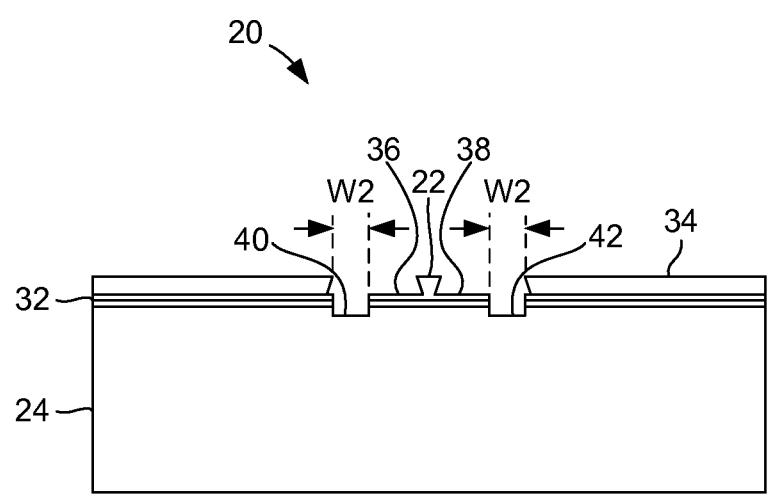
FIG. 9 is a sectional view taken on line 9-9 of FIG. 6.

As illustrated in FIGS. 7-9, ridge waveguide 22 is formed above an active multiple quantum well (MQW) layer 32. When semiconductor structure 20 is in operation, active MQW layer 32 produces gain (e.g., in an instance in which semiconductor 20 is used to form a laser or similar device) or absorption (e.g., in an instance in which semiconductor 20 is used to form a photodetector or similar device), as well understood by persons skilled in the art. As also well understood by persons skilled in the art, in operation, ridge waveguide 22 provides gain and optical confinement.

Figure 5:
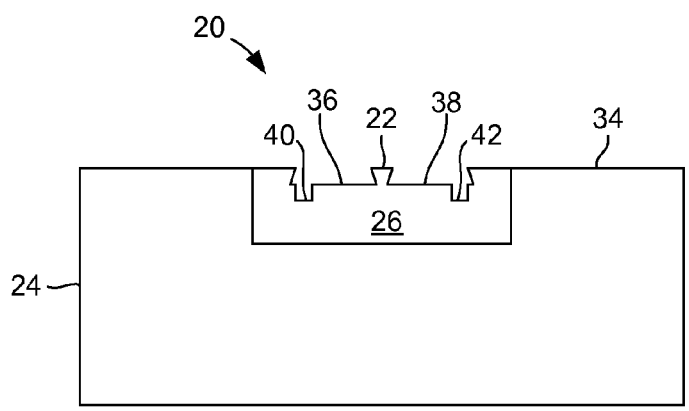
FIG. 5 is an end elevation view of the device of FIG. 4.

With reference to FIGS. 5, 8 and 9, note that ridge waveguide 22 is level with the top surface 34 of the surrounding structure and rises above regions 36 and 38 that are recessed below top surface 34. Within regions 36 and 38 are two trenches 40 and 42, respectively, that extend down to substrate 24 through active MQW layer 32 (FIGS. 8-9). Like ridge waveguide 22, each of trenches 40 and 42 extends substantially in the longitudinal direction between opposing etched end facets 30. Ridge waveguide 22 thus extends in the longitudinal direction between trenches 40 and 42. Conversely, it can be noted that trenches 40 and 42 extend in the longitudinal direction on opposite sides of ridge waveguide 22. As trenches 40 and 42 extend down to substrate 24, they serve to isolate the active region in active MQW layer 32.

As described in further detail below, trenches 40 and 42 have non-uniform widths that promote even distribution of photoresist or similar material. The mid-portion 44 (FIG. 6) of trench 40 is wider than the end portions 46 of trench 40. That is, the width (FIG. 9, "W2") of mid-portion 44 of trench 40 is greater than the width (FIG. 8, "W1") of end portions 46 of trench 40. Similarly, the mid-portion 48 (FIG. 6) of trench 42 is wider than the end portions 50 of trench 42. That is, the width (FIG. 9, "W2") of mid-portion 48 of trench 42 is greater than the width (FIG. 8, "W1") of end portions 50 of trench 42. The terms "mid-portion" and "end portion" are intended to refer to a portion of trenches 40 and 42 that, like trenches 40 and 42 as a whole, is elongated in substantially the longitudinal direction. The width ("W2") of mid-portions 44 and 48 can be, for example, between about twice the width ("W1") of end portions 46 and 50, respectively, and about three times the width ("W1") of end portions 46 and 50, respectively. In the exemplary embodiment, mid-portion 44 of trench 40 is longer than either of end portions 46 of trench 40, and the total length of mid-portion 44 and end portions 46 is substantially the same as the length of ridge waveguide 22 (minus the length of transition portions 49, described below). Likewise, mid-portion 48 of trench 42 is longer than either of end portions 50 of trench 42, and the total length of mid-portion 48 and end portions 50 is substantially the same as the length of ridge waveguide 22 (minus the length of transition portions 51, described below).

In the exemplary embodiment, the two trenches 40 and 42 are symmetrical (i.e., mirror each other in shape). Nevertheless, in other embodiments (not shown) the two trenches can be asymmetrical or otherwise differ in shape from each other.

In the illustrated embodiment, mid-portion 44 has a uniform width and uniform depth along its length. Nevertheless, in other embodiments (not shown), such a mid-portion can vary in width along its length or otherwise have features that extend laterally to the longitudinal direction. In the context of such other embodiments, the "width" of such a mid-portion refers to the total volume of the mid-portion of the trench, e.g., (length)×(width)×(depth). In the exemplary embodiment, transition portions 49 of trench 40 are angled to provide a transition between each end portion 46 and mid-portion 44. Similarly, transition portions 51 of trench 42 are angled to provide a transition between each end portion 50 and mid-portion 48. The length of each of transition portions 49 can be, for example, greater than or equal to about 10 times the width ("W1") of end portions 46. Similarly, the length of each of transition portions 51 can be, for example, greater than or equal to about 10 times the width ("W1") of end portions 50. Although in the exemplary embodiment transition portions 49 and 51 are linear, in other embodiments they can have a non-linear or curved shape.

Figure 10:
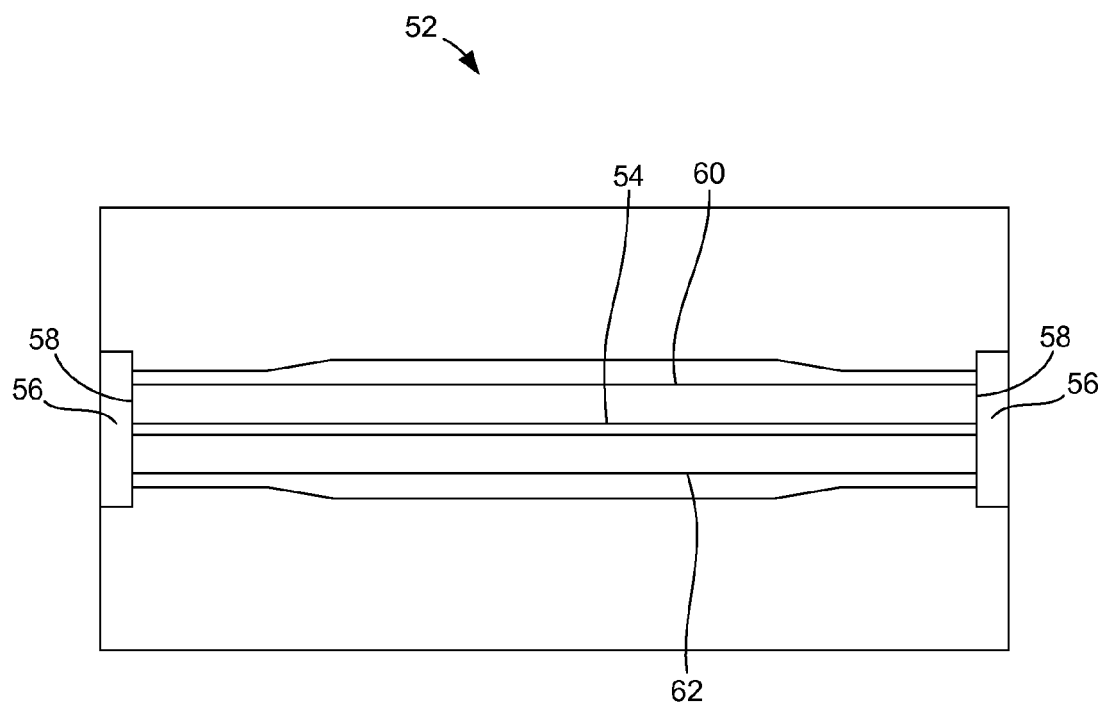
FIG. 10 is a schematic top plan view of another edge-emitting optical semiconductor device in accordance with another exemplary embodiment of the present invention.

As illustrated in FIG. 10, in another illustrative or exemplary embodiment of the invention, an etched facet edge-emitting optical semiconductor structure 52 includes a ridge waveguide 54, windows 56, end facets 58, and two trenches 60 and 62. Except as specifically described herein, semiconductor structure 52 is identical to above-described semiconductor structure 20. Therefore, for purposes of brevity, details of structure 52 are not repeated. The difference between semiconductor structures 52 and 20 lies in their inverse trench shapes. In semiconductor structure 20, the edges of trenches 40 and 42 that are closest to ridge waveguide 22 differ in distance from ridge waveguide 22 while the edges of trenches 40 and 42 that are farthest from ridge waveguide 22 are uniformly distant from (i.e., parallel to) ridge waveguide 22, thereby defining the two different widths W1 and W2. In contrast, in semiconductor structure 52, the edges of trenches 60 and 62 that are farthest from ridge waveguide 54 differ in distance from ridge waveguide 54 while the edges of trenches 60 and 62 that are closest to ridge waveguide 54 are uniformly distant from (i.e., parallel to) ridge waveguide 54. In both the embodiment illustrated in FIGS. 4-9 and the embodiment illustrated in FIG. 10, the respective pairs of trenches 40 and 42 and trenches 60 and 62 are wider at their mid-portions than at their end portions.

Figure 11:
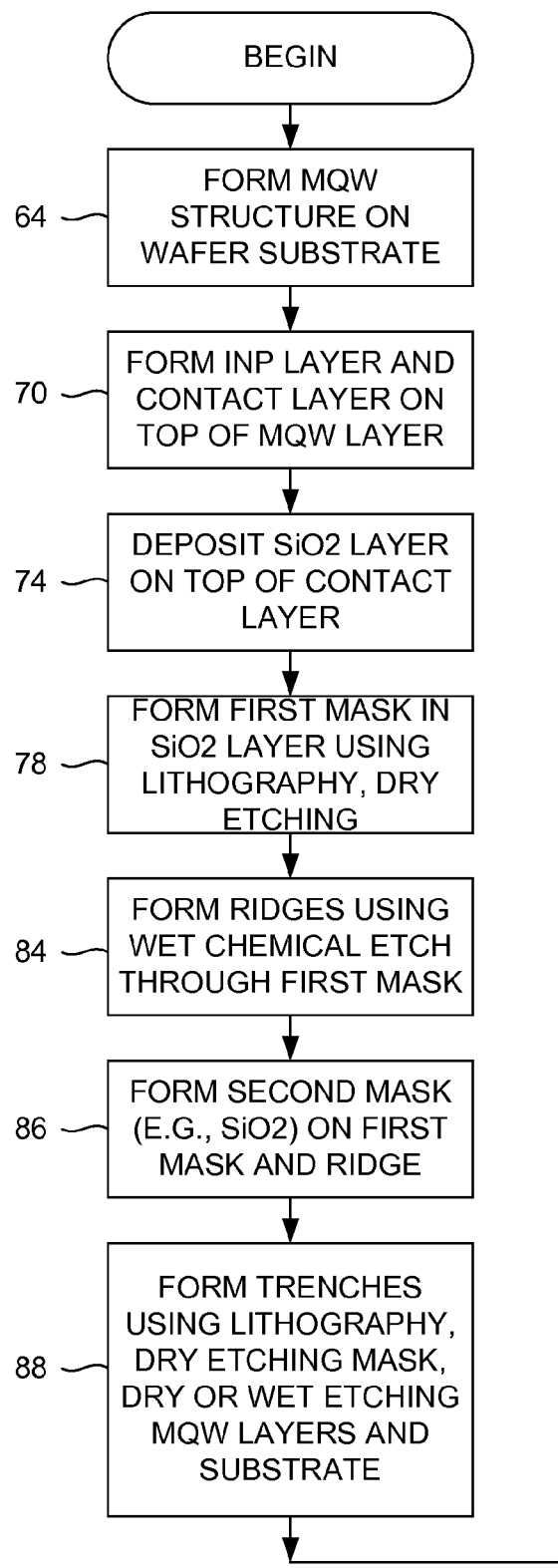
FIG. 11 is a flow diagram illustrating a method for fabricating edge-emitting optical semiconductor devices.
Figure 11:
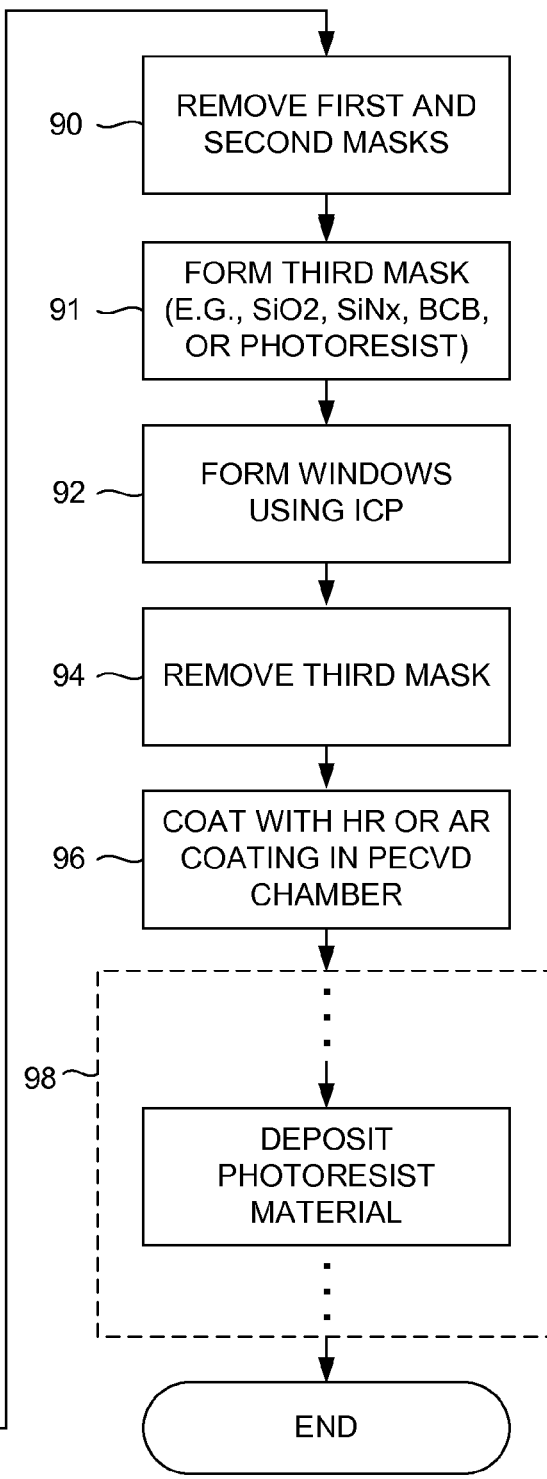

A method for fabricating the above-described edge-emitting optical semiconductor structures is illustrated in FIG. 11 and described with further reference to FIGS. 12-22 (not to scale). Although not shown for purposes of clarity, it should be understood that the method can be performed on a semiconductor wafer having many such semiconductor structures.

Figure 12:
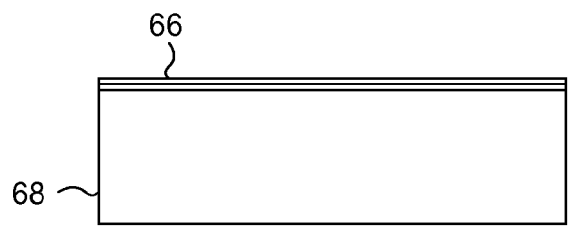
FIG. 12 illustrates a first step in an exemplary method for fabricating edge-emitting optical semiconductor devices.

As indicated by block 64, and with further reference to FIG. 12, one or more active MQW layers 66 are formed on a substrate 68. Substrate 68 is made of a suitable semiconductor material such as indium phosphide (InP). Although InP is used in this exemplary embodiment, it should be understood that in other embodiments other materials can be used for substrate 68 or other layers, including materials such as gallium arsenide (GaAs), aluminum gallium (AlGa), aluminum gallium indium arsenide (AlGaInAs), etc. Persons skilled in the art will be readily capable of selecting suitable materials in view of the teachings herein.

Figure 13:
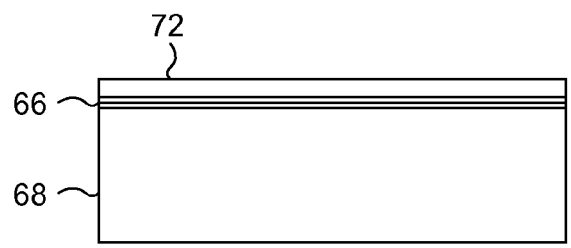
FIG. 13 illustrates a second step in the exemplary method for fabricating edge-emitting optical semiconductor devices.

As indicated by block 70, and with further reference to FIG. 13, additional semiconductor layers 72 comprising, for example, InP and electrical contact material are formed over the one or more active MQW layers 66. Although not separately shown for purposes of clarity, such an InP layer can be formed over the active MQW layers 66, and such an electrical contact layer can be formed over the InP layer.

Figure 14:
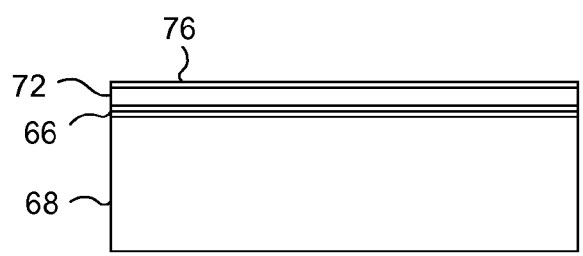
FIG. 14 illustrates a third step in the exemplary method for fabricating etched-facet integrated devices and semiconductor lasers.
Figure 15:
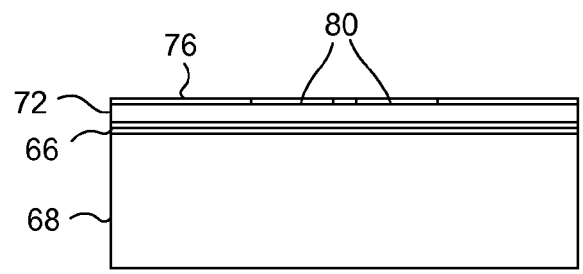
FIG. 15 illustrates a fourth step in the exemplary method for fabricating edge-emitting optical semiconductor devices.
Figure 16:
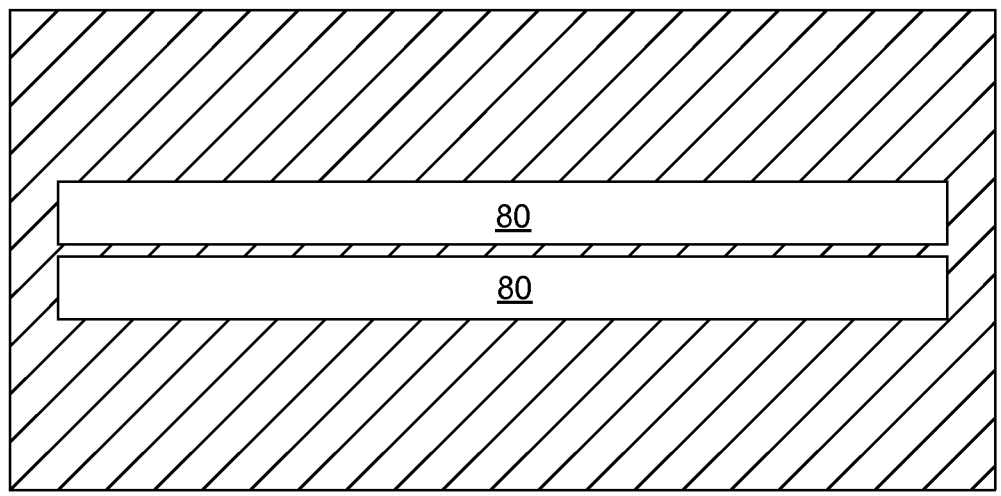
FIG. 16 is a schematic plan view showing the first mask in the exemplary fabrication method.

As indicated by block 74, and with further reference to FIG. 14, a first mask layer 76 of, for example, SiO2 is formed over the one or more active MQW layers 66 and the additional semiconductor layers 72. As indicated by block 78, and with further reference to FIGS. 15 and 16, a first mask is formed in first mask layer 76 by using lithography and dry-etch to remove ridge waveguide regions 80. In FIG. 16, the hatched regions represent the SiO2 or other first mask material, and the non-hatched regions represent openings (i.e., ridge waveguide regions 80) through the first mask. The first mask thus defines ridge waveguide regions 80.

Figure 17:
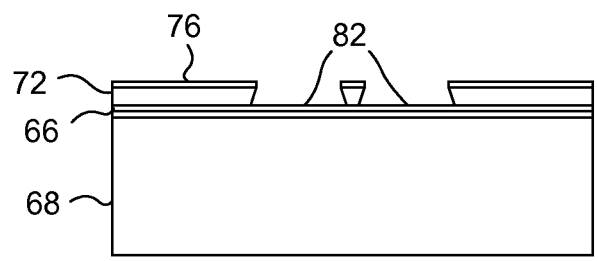
FIG. 17 illustrates a fifth step in the exemplary method for fabricating edge-emitting optical semiconductor devices.

As indicated by block 84, and with further reference to FIG. 17, a wet chemical etch can be used to etch the first mask (through ridge waveguide regions 80) to form a ridge waveguide corresponding to the ridge waveguide regions 80. The ridge waveguide is delineated by a pair of recessed regions 82 (FIG. 17), which correspond to regions 36 and 38 in the embodiment described above with regard to FIGS. 4-9.

Figure 18:
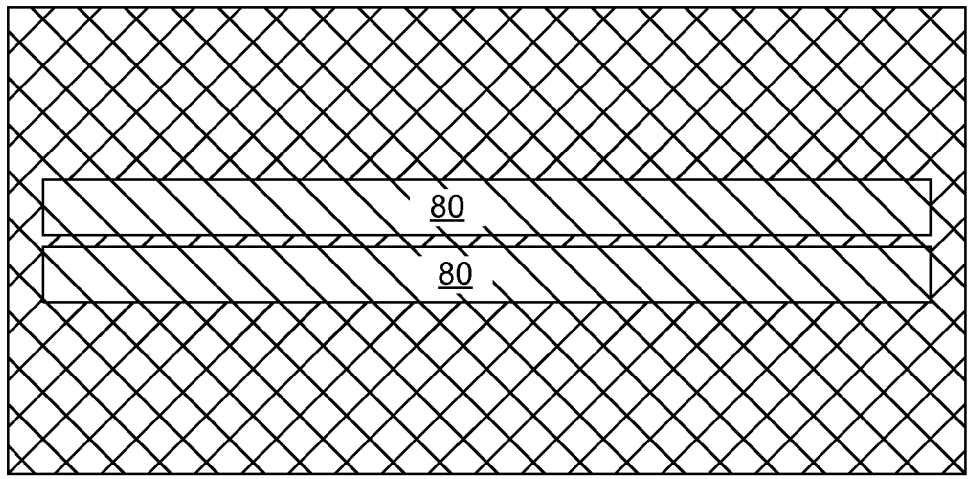
FIG. 18 illustrates a sixth step in the exemplary method for fabricating edge-emitting optical semiconductor devices.

As indicated by block 86, and with further reference to FIG. 18, a second mask is formed by depositing a layer of a dielectric mask material, such as SiO2 or SiNx material, over the resulting structure. The two types of hatching in FIG. 18 represent first and second masks.

Figure 19:
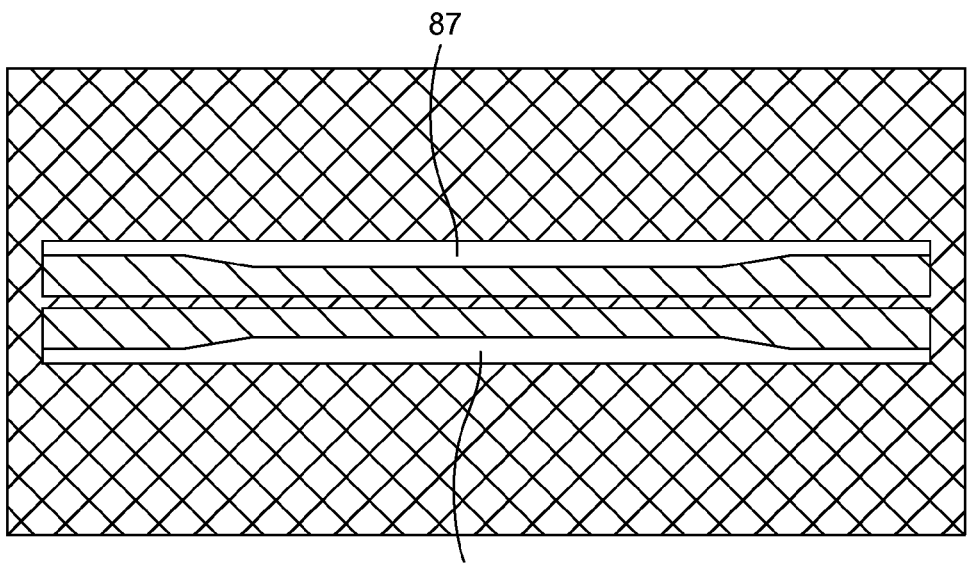
FIG. 19 illustrates a seventh step in the exemplary method for fabricating edge-emitting optical semiconductor devices.

As indicated by block 88, and with further reference to FIG. 19, a material removal process is used to remove trench regions 87 that define the above-described trenches. First, the mask is etched by lithography and dry-etch. Then, the semiconductor material is removed down to the substrate, through the MQW region. The material removal process can comprise, for example, inductively coupled plasma (ICP), reactive ion etching (RIE), or wet chemical etching. The trenches can have the shapes and other characteristics described above with regard to FIGS. 4-9. The material removal process is performed to a depth down to the substrate, such that the active MQW layers 66 are removed. As indicated by block 90, the first and second masks are then removed.

Figure 20:
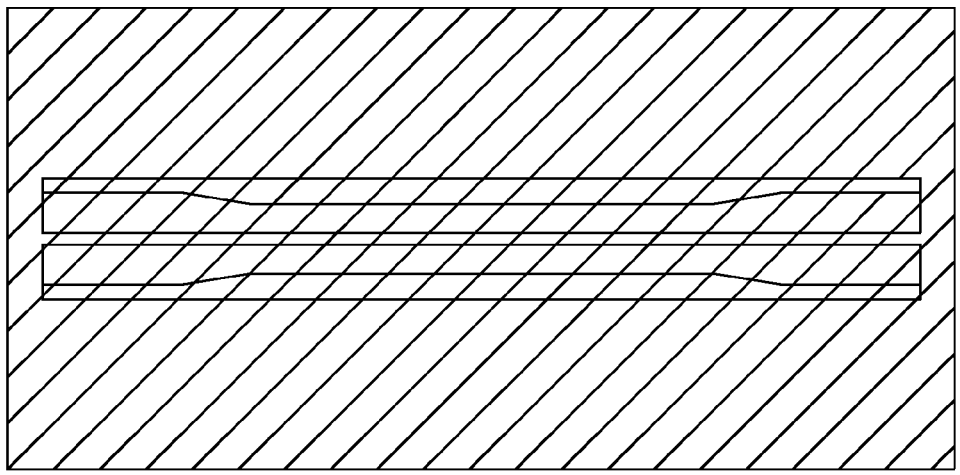
FIG. 20 illustrates an eighth step in the exemplary method for fabricating edge-emitting optical semiconductor devices.

As indicated by block 91, and with further reference to FIG. 20, a third mask is formed by depositing a layer of a dielectric mask material, such as SiO2, SiNx, BCB, or photoresist material, over the resulting structure. The hatching in FIG. 20 represents this third mask material layer.

Figure 21:
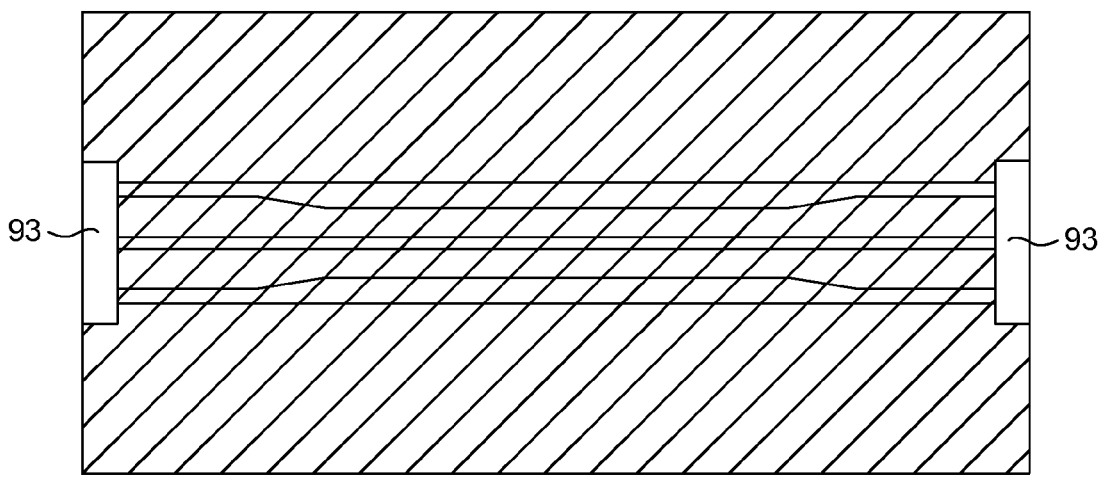
FIG. 21 illustrates a ninth step in the exemplary method for fabricating edge-emitting optical semiconductor devices.

As indicated by block 92, and with further reference to FIG. 21, a material removal process is used to remove window regions 93 that define the above-described windows. The material is removed down to the substrate, through the MQW region. The material removal process can comprise, for example, inductively coupled plasma (ICP) etching. As indicated by block 94, the third mask is then removed, and the surface of the structure is cleaned of any remaining mask residue.

As indicated by block 96, the resulting etched facets are coated with an optical coating. For example, the structure (or wafer having many of such structures) can be placed in a Plasma-Enhanced Chemical Vapor Deposition (PECVD) chamber, and either an HR or, alternatively, an AR coating can be applied. In an embodiment in which the method is used to fabricate a Fabry-Perot (FP) laser, an HR coating can be applied with SiO2/SiNx or other dielectric multi-layer stacks. In an embodiment in which the method is used to fabricate a Distributed Feedback (DFB) laser, an AR coating can be applied. It should be understood that the above-described method can be used to fabricate not only FP lasers and DFB lasers but also any other suitable type of semiconductor laser, such as a modulator, amplifier, waveguide, or photodetector. Furthermore, the method can be used to fabricate not only lasers but any suitable etched-facet devices, including the integrated devices described below with regard to FIGS. 23-24.

Figure 1:
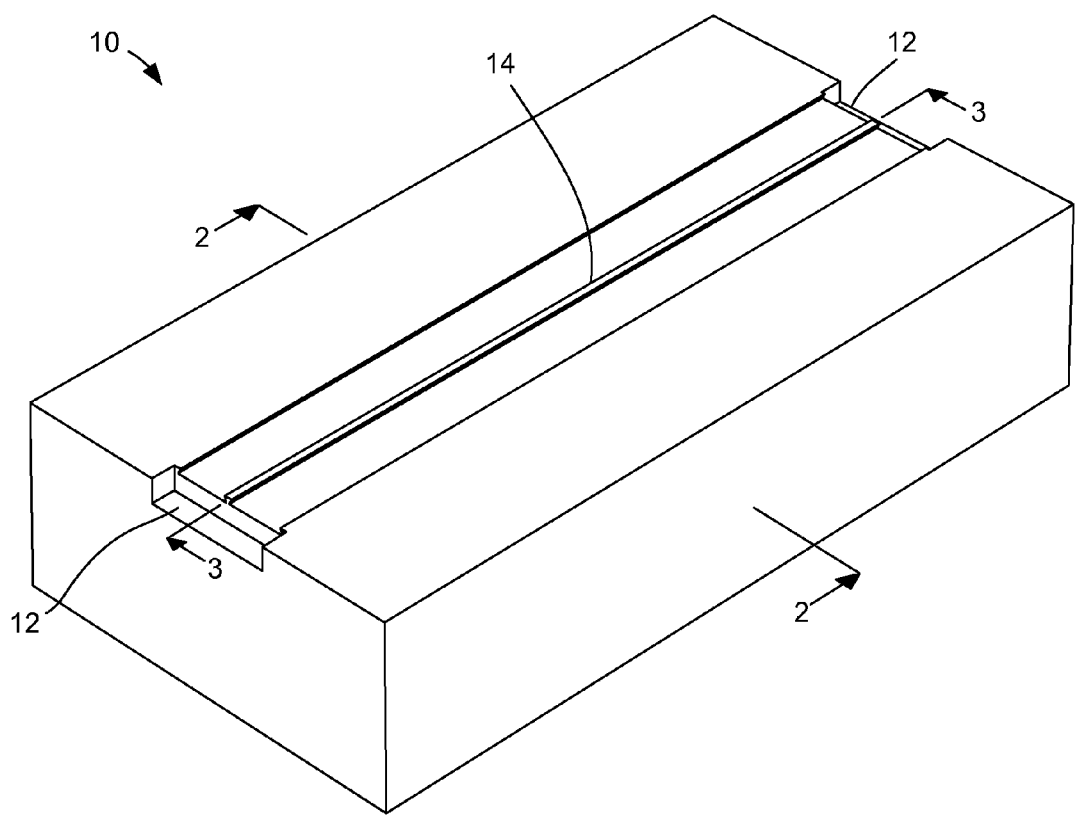
FIG. 1 is a perspective view of an edge-emitting optical semiconductor device in accordance with the prior art.
Figure 2:
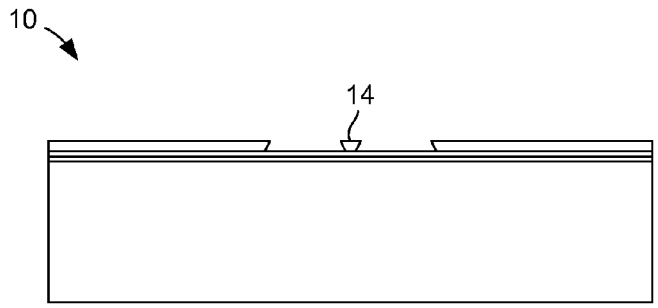
FIG. 2 is a sectional view taken on line 2-2 of FIG. 1.
Figure 3:
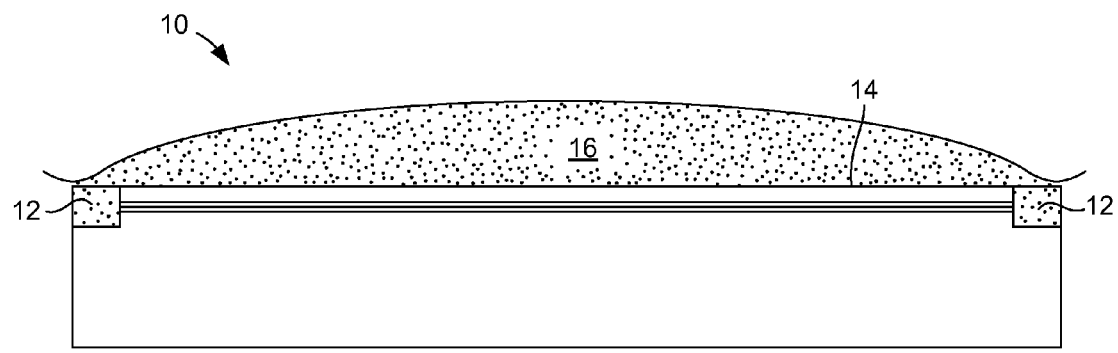
FIG. 3 is a sectional view taken on line 3-3 of FIG. 1.
Figure 4:
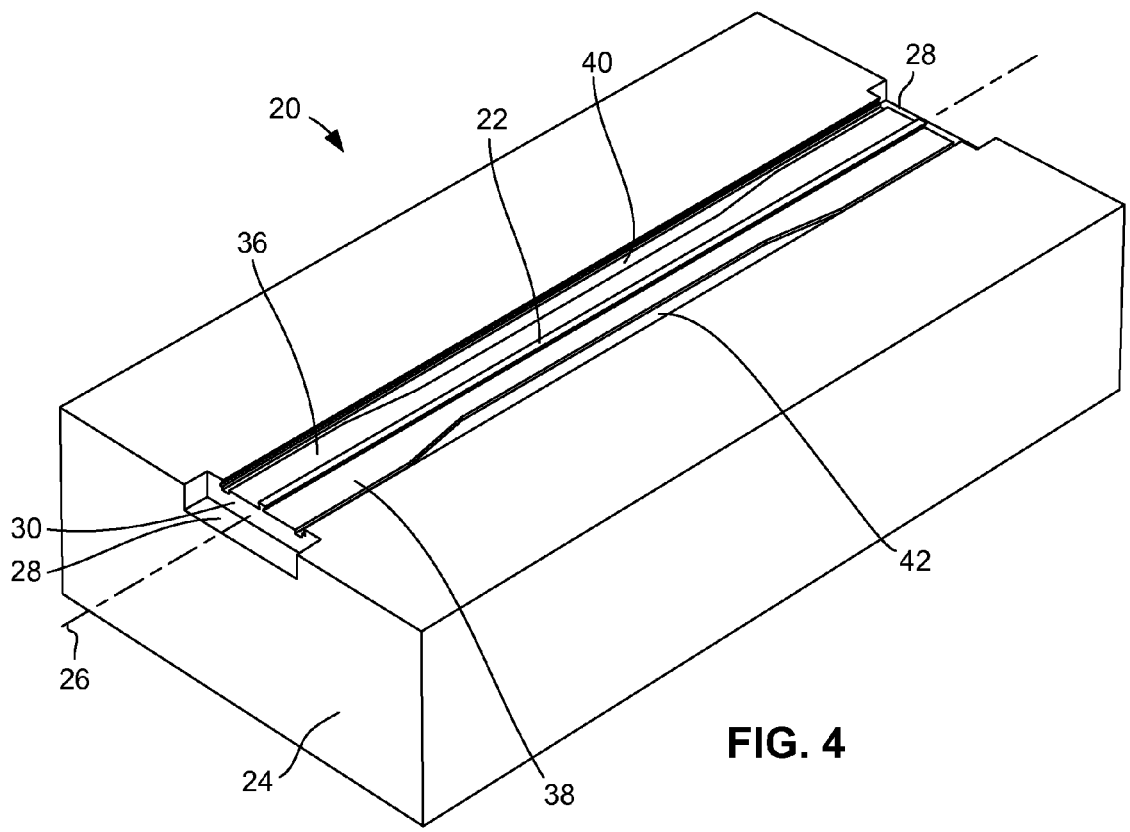
FIG. 4 is a perspective view of an edge-emitting optical semiconductor device in accordance with an exemplary embodiment of the present invention.
Figure 22:
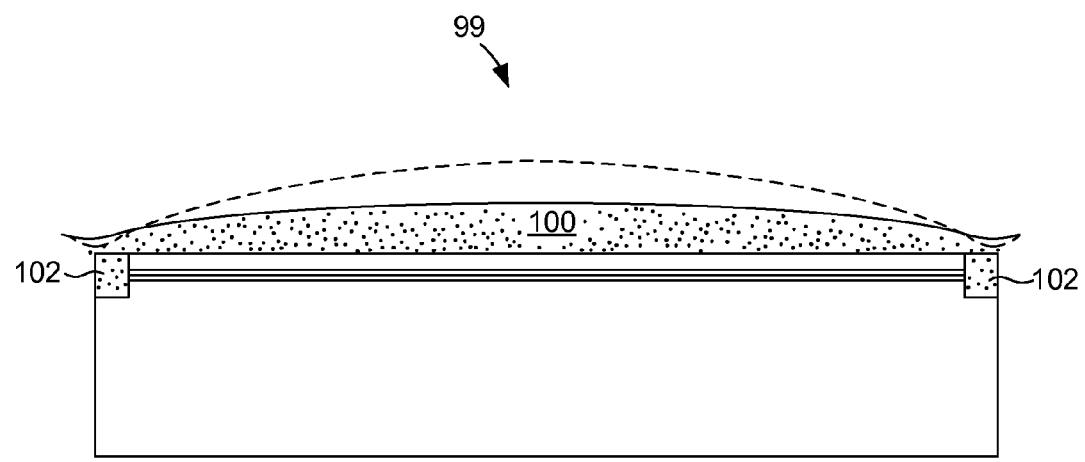
FIG. 22 is a side elevation view of an edge-emitting optical semiconductor device in accordance with exemplary embodiments of the invention, showing the effect of application of photoresist material.

As indicated by block 98, additional fabrication steps, including opening a metal contact region (not shown) on the ridge surface by depositing a photoresist material or similar material on the surface for lithography, can be performed on the resulting semiconductor structure. The effect of depositing the photoresist material is illustrated in FIG. 22 (not to scale). Because, as described above with regard to FIGS. 4-9, the trenches are wider at their mid-portions than at their end portions, the photoresist material 100 does not pool in windows 102 but rather accumulates in substantially uniform thickness all along the length of the semiconductor structure 99. The wider mid-portions of the trenches absorb some of the photoresist material that would otherwise build up there compared with the end portions. As illustrated in FIG. 22, the effect of the non-uniform trench widths is to cause the photoresist material 100 to be not substantially thicker in the middle of the semiconductor structure than nearer to windows 102. A uniform photoresist layer helps facilitate fabrication of etched-facet devices. This effect can be contrasted with the less uniformly thick layer of photoresist material 16 described above with regard to FIG. 3. The surface of such a less uniformly thick layer of photoresist material is also shown in broken line in FIG. 22 for contrast with the more uniformly thick layer of photoresist material 100.

Figure 23:
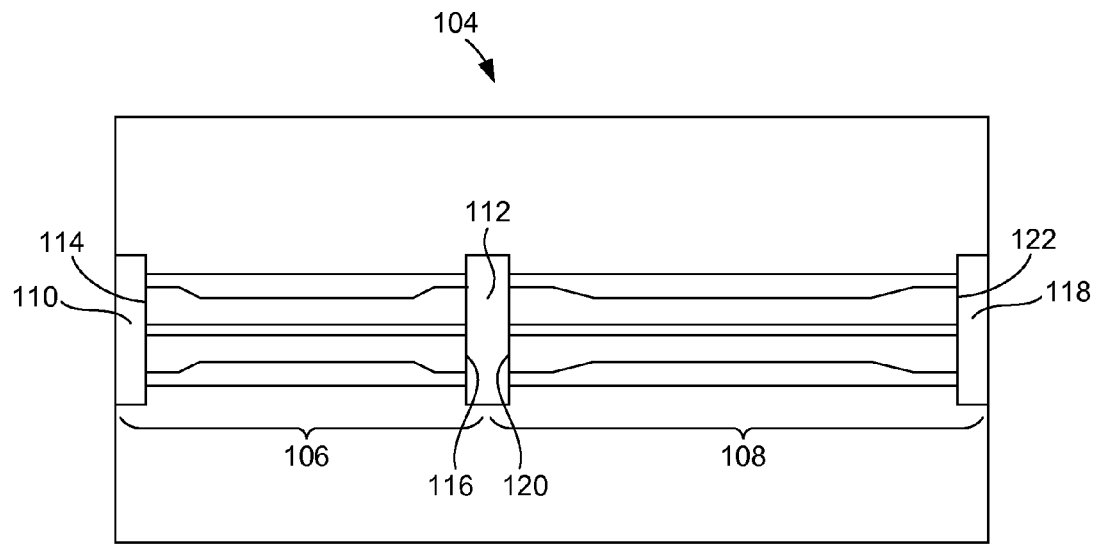
FIG. 23 is a schematic top plan view of an integrated edge-emitting optical semiconductor device in accordance with still another exemplary embodiment of the invention.

As illustrated in FIG. 23 (not to scale), in still another exemplary embodiment, another semiconductor structure 104 comprises two waveguide portions 106 and 108 adjoining each other in an end-to-end fashion on a common substrate. Each of waveguide portions 106 and 108 can be similar to semiconductor structure 20 described above with regard to the embodiment illustrated in FIGS. 4-9. Therefore, for purposes of brevity, details of waveguide portions 106 and 108 are not repeated with regard to this embodiment. It can be noted that waveguide portion 106 includes windows 110 and 112 having end facets 114 and 116, respectively. Similarly, waveguide portion 108 includes windows 112 and 118 having end facets 120 and 122, respectively. Note that window 112 is shared by waveguide portions 106 and 108.

To form "single" edge-emitting optical semiconductor devices of the type described above with regard to FIGS. 4-10, a semiconductor wafer (not shown in its entirety for purposes of clarity) processed as described above with regard to FIGS. 11-22 can be cut along a line through the middle of such a shared window 112 perpendicular to the longitudinal axis to separate waveguide portions 106 and 108 from each other. Alternatively, an "integrated" edge-emitting optical semiconductor device can be formed by leaving the two waveguide portions 106 and 108 adjoining one another as shown in FIG. 23, and cutting or otherwise separating such a two-waveguide structure from all other waveguide portions on the wafer. For example, waveguide portion 108 can be configured to operate as a laser (e.g., in operation, provided with a positive bias voltage), while waveguide portion 106 can be configured to operate as a photodetector (e.g., in operation, provided with a negative bias voltage). As waveguide portions 106 and 108 share the same active MQW layers, it is important to provide isolation between waveguide portions 106 and 108. The trenches also help to provide such isolation, thereby inhibiting electrical crosstalk between waveguide portions 106 and 108.

Figure 24:
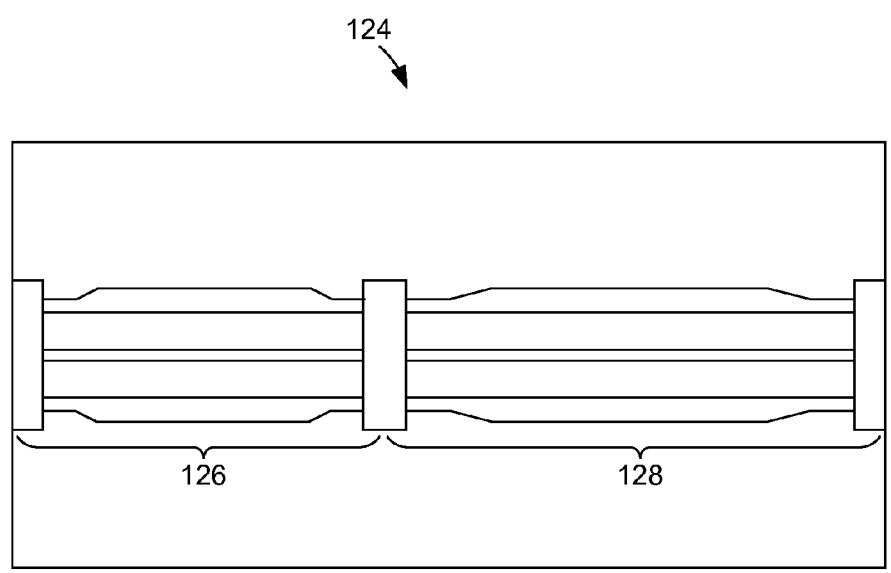
FIG. 24 is similar to FIG. 23, illustrating yet another integrated edge-emitting optical semiconductor device in accordance with yet another exemplary embodiment of the invention.

As illustrated in FIG. 24, in yet another illustrative or exemplary embodiment of the invention, an etched-facet edge-emitting optical semiconductor structure 124 comprises two waveguide portions 126 and 128. Except as specifically described herein, semiconductor structure 124 is identical to above-described semiconductor structure 104. Therefore, for purposes of brevity, details of semiconductor structure 124 are not repeated. The difference between semiconductor structures 124 and 104 lies in their inverse trench shapes. More specifically, semiconductor structure 104 has a trench shape similar to that of semiconductor 20 described above with regard to FIGS. 4-9, while semiconductor structure 124 has a trench shape similar to that of semiconductor structure 52 described above with regard to FIG. 10.

One or more illustrative embodiments of the invention have been described above. However, it is to be understood that the invention is defined by the appended claims and is not limited to the specific embodiments described.

What is claimed is:

1. An edge-emitting optical semiconductor device, comprising:
 a substrate;
 an active multiple quantum well (MQW) region formed on the substrate;
 a first ridge waveguide extending between a first end facet disposed in a first window and a second end facet disposed in a second window, the first ridge waveguide formed over the active MQW region; and
 a first trench extending longitudinally between the first and second windows and extending down to the substrate through the active MQW region, the first trench having a first wider mid-portion than opposing end portions, wherein the first wider mid-portion is configured to promote an even distribution of a material along a length of the first trench by preventing pooling of the material in the first and second windows during depositing of the material in the first trench.

2. The edge-emitting optical semiconductor device of claim 1, wherein the first ridge waveguide is substantially aligned with a longitudinal axis extending between the first end facet and the second end facet, and wherein a first wall of a pair of opposing first and second walls of the first trench extends linearly between the first and second windows substantially parallel to the first ridge waveguide.

3. The edge-emitting optical semiconductor device of claim 2, wherein the first wall is closer to the first ridge waveguide than the second wall.

4. The edge-emitting optical semiconductor device of claim 1, wherein the first trench extends parallel to a first longitudinal edge of the first ridge waveguide, and further comprising:
 a second trench that extends parallel to an opposing longitudinal edge of the first ridge waveguide, the second trench extending down to the substrate through the active MQW region.

5. The edge-emitting optical semiconductor device of claim 1, wherein:
 the first trench further comprises a trench transition portion between the mid-portion of the first trench and each end portion of the first trench, the trench transition portion having at least one width different from a width of the first wider mid-portion.

6. The edge-emitting optical semiconductor device of claim 1, further comprising:
 a second ridge waveguide extending between a third end facet disposed in a third window and the second end facet that is disposed in the second window, the second ridge waveguide formed over the active MQW region, thereby sharing with the first ridge waveguide, the second window and the active MQW region; and a second trench extending between the second and third windows, the second trench having a second wider mid-portion than opposing end portions, wherein the second wider mid-portion is configured to promote uniform thickness in the layer of material deposited in the second trench by preventing pooling of the material in the second and third windows during depositing of the material in the second trench.

7. The edge-emitting optical semiconductor device of claim 1, wherein the material deposited in the first trench is a photoresist material that tends to flow into the first and second windows during depositing of the photoresist material in the first trench.

8. The edge-emitting optical semiconductor device of claim 7, wherein the first wider mid-portion promotes the even distribution of the photoresist material along the length of the first trench by absorbing a portion of the photoresist material during depositing of the photoresist material in the first trench.

9. The edge-emitting optical semiconductor device of claim 8, wherein the first wider mid-portion has a width that is between two times and three times a width of each of the opposing end portions.

10. An edge-emitting optical semiconductor device, comprising:
   A substrate;
   an active multiple quantum well (MQW) region formed on the substrate;
   a first ridge waveguide extending between a first end facet disposed in a first window and a second end facet disposed in a second window, the first ridge waveguide formed over the active MQW region; and
   a first trench extending between the first and second windows and extending down to the substrate through the active MQW region, the first trench comprising a mid-portion having a larger volume than opposing end portions, the larger volume of the mid-portion defined on the basis of reducing a buildup of a material in the mid-portion of the first trench during depositing of the material in the first trench.

11. The edge-emitting optical semiconductor device of claim 10, wherein the material deposited in the first trench is a photoresist material that flows into the mid-portion of the first trench during depositing of the material, and the larger volume of the mid-portion promotes uniform thickness of the photoresist material along the length of the first trench by retaining a portion of the photoresist material in the mid-portion.

12. The edge-emitting optical semiconductor device of claim 10, wherein the first ridge waveguide is substantially aligned with a longitudinal axis extending between the first end facet and the second end facet of the edge-emitting optical semiconductor device, and wherein a first wall of a pair of opposing first and second walls of the first trench extends linearly between the first and second windows substantially parallel to the first ridge waveguide.

13. The edge-emitting optical semiconductor device of claim 10, wherein the larger volume of the mid-portion is defined at least in part, on the basis of a width of the mid-portion.

14. The edge-emitting optical semiconductor device of claim 13, wherein the width of the mid-portion is between two times and three times a width of each of the opposing end portions.

15. The edge-emitting optical semiconductor device of claim 10, wherein the larger volume of the mid-portion is defined on the basis of a length of the mid-portion multiplied by a width of the mid-portion and further multiplied by a depth of the mid-portion.

16. An edge-emitting optical semiconductor device, comprising:
   a first ridge waveguide extending from a first end facet to a second end facet, the first ridge waveguide located above a multiple quantum well (MQW) layer; and
   a first trench extending from the first end facet to the second end facet and arranged substantially parallel to the first ridge waveguide, the first trench extending down to a substrate through the MQW layer and having a first wider mid-portion than opposing end portions, the first wider mid-portion having a volume defined on the basis of reducing a buildup of a material in the first wider mid-portion during fabrication of the edge-emitting optical semiconductor device.

17. The edge-emitting optical semiconductor device of claim 16, wherein the first trench extends substantially parallel to a first longitudinal edge of the first ridge waveguide, and further comprising:
   a second trench extending from the first end facet to the second end facet and arranged substantially parallel to an opposing longitudinal edge of the first ridge waveguide, the second trench extending down to the substrate through the MQW layer.

18. The edge-emitting optical semiconductor device of claim 17, wherein the first trench and the second trench are configured to isolate an active region of the MQW layer.

* * * * *